United States Patent
Hong et al.

(10) Patent No.: US 11,837,310 B2
(45) Date of Patent: Dec. 5, 2023

(54) MEMORY DEVICE FOR CORRECTING PULSE DUTY AND MEMORY SYSTEM INCLUDING THE SAME

(71) Applicant: SK hynix Inc., Gyeonggi-do (KR)

(72) Inventors: Jaehyeong Hong, Gyeonggi-do (KR); In Seok Kong, Gyeonggi-do (KR); Gwan Woo Kim, Gyeonggi-do (KR); Jae Young Park, Gyeonggi-do (KR); Kwan Su Shon, Gyeonggi-do (KR); Soon Sung An, Gyeonggi-do (KR); Daeho Yang, Gyeonggi-do (KR); Sung Hwa Ok, Gyeonggi-do (KR); Junseo Jang, Gyeonggi-do (KR); Yo Han Jeong, Gyeonggi-do (KR); Eun Ji Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 40 days.

(21) Appl. No.: 17/569,144

(22) Filed: Jan. 5, 2022

(65) Prior Publication Data

US 2023/0056686 A1 Feb. 23, 2023

(30) Foreign Application Priority Data

Aug. 20, 2021 (KR) ........................ 10-2021-0110373

(51) Int. Cl.
*G11C 29/44* (2006.01)
*G11C 29/12* (2006.01)
*H03K 5/15* (2006.01)
*H03K 19/17736* (2020.01)
(Continued)

(52) U.S. Cl.
CPC .... *G11C 29/4401* (2013.01); *G11C 29/12015* (2013.01); *H03K 5/1565* (2013.01); *H03K 5/15066* (2013.01); *H03K 19/1774* (2013.01); *H03K 19/20* (2013.01)

(58) Field of Classification Search
CPC .......... G11C 29/4401; G11C 29/12015; G11C 2029/0411; G11C 2207/2254; G11C 7/222; G11C 29/023; G11C 29/028; G11C 7/1066; G11C 7/20; H03K 5/15066; H03K 5/1565; H03K 19/1774; H03K 19/20
See application file for complete search history.

(56) References Cited

U.S. PATENT DOCUMENTS

2017/0053684 A1* 2/2017 Choi ................. G11C 16/32
2020/0321043 A1* 10/2020 Em ................... G11C 13/0069

FOREIGN PATENT DOCUMENTS

KR  10-2017-0023294 A  3/2017
KR     10-2193883 B1   12/2020

OTHER PUBLICATIONS

Ashwin Ramachandran et al., 29.4 A 16Gb/s 3.6pJ/b Wireline Transceiver with Phase Domain Equalization Scheme: Integrated Pulse Width Modulation (iPWM) in 65nm CMOS, Optical- and Electrical-Link Innovations, 2017, p. 488-490, 978-1-5090-3758-2/17, IEEE International Solid-State Circuits Conference.

* cited by examiner

*Primary Examiner* — Thien Nguyen
(74) *Attorney, Agent, or Firm* — IP & T GROUP LLP

(57) ABSTRACT

The present disclosure relates to a memory device for correcting a pulse duty ratio and a memory system including the same, and relates to a memory device which corrects the duty ratio of a primary pulse of a memory device control signal, and a memory system including the same.

20 Claims, 11 Drawing Sheets

(51) Int. Cl.
*H03K 5/156* (2006.01)
*H03K 19/20* (2006.01)

MEMORY DEVICE FOR CORRECTING PULSE DUTY AND MEMORY SYSTEM INCLUDING THE SAME

CROSS-REFERENCE TO RELATED APPLICATION

This application claims priority under 35 U.S.C. § 119 to Korean Patent Application No. 10-2021-0110373 filed on Aug. 20, 2021, which is incorporated herein by reference in its entirety.

BACKGROUND

1. Field

Various embodiments of the present disclosure relate to a memory device for correcting a pulse duty ratio and a memory system including the same, and more particularly, to a memory device which corrects the duty ratio of a primary pulse of a control signal provided thereto, and a memory system including the same.

2. Discussion of the Related Art

Recently, the paradigm for the computer environment has changed to ubiquitous computing in which computer systems can be used anytime and anywhere. Due to this fact, the use of portable electronic devices such as mobile phones, digital cameras, and notebook computers has rapidly increased. In general, such portable electronic devices use a memory system which uses a memory device, that is, a data storage device. The data storage device is used as a main memory device or an auxiliary memory device of the portable electronic devices.

A data storage device using a nonvolatile memory device provides advantages in that, since there is no mechanical driving part unlike a hard disk, stability and durability are excellent, an information access speed is high and power consumption is small. Data storage devices having such advantages include a universal serial bus (USB) memory device, memory cards having various interfaces, and a solid state drive (SSD).

SUMMARY

Various embodiments of the present disclosure are directed to a memory device which detects a primary pulse of a memory device control signal after a preamble period of the memory device control signal ends and corrects the duty ratio of the primary pulse, and a memory system including the same.

Also, various embodiments of the present disclosure are directed to a memory device which corrects the duty ratio distortion of a primary pulse due to signal interference during a preamble period of a memory device control signal, and a memory system including the same.

In an embodiment of the present disclosure, a memory system may include: a memory device including a plurality of memory blocks and a primary pulse correction module; and a controller configured to transmit a control signal for controlling the memory device, wherein the primary pulse correction module includes: a reset signal generation circuit configured to generate a reset signal on the basis of the control signal; a primary pulse detection circuit configured to output a detection signal by detecting a primary pulse of the control signal on the basis of the reset signal; and a corrected primary pulse output circuit configured to correct the primary pulse on the basis of the detection signal.

In another embodiment of the present disclosure, a memory device may include: a reset signal generation circuit configured to generate a reset signal on the basis of a control signal; a primary pulse detection circuit configured to output a detection signal by detecting a primary pulse of the control signal on the basis of the reset signal; and a corrected primary pulse output circuit configured to correct the primary pulse on the basis of the detection signal.

In another embodiment of the present disclosure, an operating method of a memory device, the operating method may include detecting a pulse of a data strobe signal immediately after an end of a preamble section of the data strobe signal; and correcting a duty ratio of the pulse by adjusting a rising edge of the pulse.

The memory device and the memory system including the same according to the embodiments of the present disclosure may detect a primary pulse of a memory device control signal after a preamble period of the memory device control signal ends and may correct the duty ratio of the primary pulse.

Also, the memory device and the memory system including the same according to the embodiments of the present disclosure may correct the duty distortion of a primary pulse due to signal interference during a preamble period of a memory device control signal.

DETAILED DESCRIPTION

Figure 1:
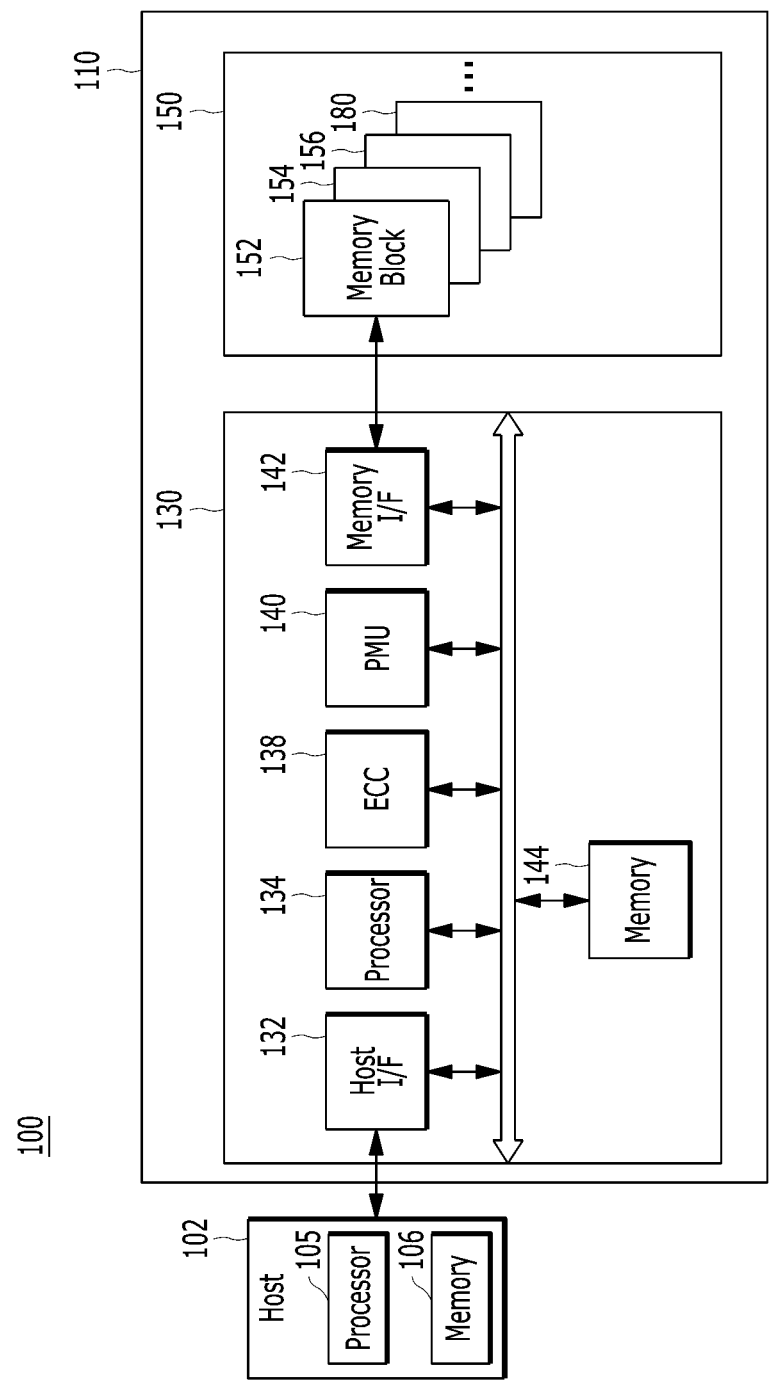
FIG. 1 is a diagram schematically illustrating an example of a data processing system including a memory system in accordance with an embodiment of the present disclosure.

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

FIG. 1 is a diagram schematically illustrating an example of a data processing system including a memory system in accordance with an embodiment of the present disclosure.

Referring to FIG. 1, a data processing system 100 may include a host 102 and a memory system 110.

The host 102 includes electronic devices, for example, portable electronic devices such as a mobile phone, an MP3 player and a laptop computer or electronic devices such as a desktop computer, a game machine, a TV and a projector, that is, wired and wireless electronic devices.

The host 102 includes at least one operating system (OS). The operating system generally manages and controls the function and operation of the host 102, and provides interoperability between the host 102 and a user using the data processing system 100 or the memory system 110. The operating system supports functions and operations corresponding to the user's purpose of use and the use of the operating system. For example, the operating system may be classified into a general operating system and a mobile operating system depending on the mobility of the host 102. Also, the general operating system as the operating system may be classified into a personal operating system and an enterprise operating system depending on the user's usage environment. For example, the personal operating system is a system characterized to support a service providing function for a general user and may include windows and chrome, and the enterprise operating system is a system characterized to secure and support high performance and may include Windows server, Linux and Unix. In addition, the mobile operating system in the operating system is a system characterized to support a mobility service providing function and a system power saving function to users and may include Android, iOS, Windows mobile, etc. The host 102 may include a plurality of operating systems, and executes the operating systems to perform operations with the memory system 110 corresponding to a user request. The host 102 transmits a plurality of commands corresponding to a user request to the memory system 110, and accordingly, the memory system 110 performs operations corresponding to the commands, that is, operations corresponding to the user request.

The memory system 110 operates in response to a request of the host 102, and particularly, stores data to be accessed by the host 102. The memory system 110 may be used as a main memory device or an auxiliary memory device of the host 102. The memory system 110 may be implemented as any of various storage devices, depending on a host interface protocol which is coupled with the host 102. For example, the memory system 110 may be realized as any various storage devices such as a solid state driver (SSD), a multimedia card in the form of an MMC, an eMMC (embedded MMC), an RS-MMC (reduced size MMC) and a micro-MMC, a secure digital card in the form of an SD, a mini-SD and a micro-SD, a universal serial bus (USB) storage device, a universal flash storage (UFS) device, a compact flash (CF) card, a smart media card, a memory stick, and so forth.

The storage devices which implement the memory system 110 may be implemented by a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM), a resistive RAM (RRAM) and a flash memory.

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and thereby configure an SSD. In the case where the memory system 110 is used as an SSD, the operating speed of the host 102 which is coupled to the memory system 110 may be improved. Further, the controller 130 and the memory device 150 may be integrated into one semiconductor device and configure a memory card. For example, the controller 130 and the memory device 150 may configure a memory card such as a PC card (PCMCIA: Personal Computer Memory Card International Association), a compact flash card (CF), a smart media card (SM and SMC), a memory stick, a multimedia card (MMC, RS-MMC and MMCmicro), an SD card (SD, miniSD, microSD and SDHC) and a universal flash storage (UFS).

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID (radio frequency identification) device, or one of various component elements configuring a computing system.

The memory device 150 in the memory system 110 may maintain stored data even though power is not supplied. In particular, the memory device 150 in the memory system 110 stores data provided from the host 102, through a write operation, and provides stored data to the host 102, through a read operation. The memory device 150 includes a plurality of memory blocks 152, 154, 156 and 180. Each of the memory blocks 152, 154, 156 and 180 includes a plurality of pages. Each of the pages includes a plurality of memory cells to which a plurality of word lines (WL) are coupled. Also, the memory device 150 includes a plurality of planes each of which includes the plurality of memory blocks 152, 154, 156 and 180. In particular, the memory device 150 may include a plurality of memory dies each of which includes a plurality of planes. The memory device 150 may be a nonvolatile memory device, for example, a flash memory, and the flash memory may have a 3D stack structure.

Detailed descriptions will be made below with reference to FIGS. 2 to 4 for the structure of the memory device 150 and the 3-dimensional stack structure of the memory device 150, and detailed descriptions for a plurality of planes each including the plurality of memory blocks 152, 154, 156 and 180, a plurality of memory dies each including a plurality of planes and the memory device 150 including the plurality of memory dies will be omitted herein.

The controller 130 in the memory system 110 controls the memory device 150 in response to a request from the host 102. For example, the controller 130 provides the data read from the memory device 150, to the host 102, and stores the data provided from the host 102, in the memory device 150. To this end, the controller 130 controls the operations of the memory device 150, such as read, write, program, and erase operations.

In detail, the controller 130 includes a host interface unit (Host I/F) 132, a processor (Processor) 134, an error correction code unit (ECC) 138, a power management unit (PMU) 140, a memory interface unit (Memory I/F) 142 and a memory 144.

The host interface unit 132 processes the commands and data of the host 102, and may be configured to communicate with the host 102 through at least one of various communication standards or interfaces such as universal serial bus (USB), multimedia card (MMC), peripheral component interconnect-express (PCI-e or PCIe), serial attached SCSI (SAS), serial advanced technology attachment (SATA), parallel advanced technology attachment (PATA), small computer system interface (SCSI), enhanced small disk interface (ESDI), integrated drive electronics (IDE) and MIPI (mobile industry processor interface). The host interface unit 32 may be driven through a firmware which is referred to as a host interface layer (HIL), as a region which exchanges data with the host 102.

The ECC unit 138 may correct an error bit of the data processed in the memory device 150, and may include an ECC encoder and an ECC decoder. The ECC encoder may error correct-encode data to be programmed in the memory device 150 and generate data added with parity bits. The data added with parity bits may be stored in the memory device 150. The ECC decoder detects and corrects an error included in data read from the memory device 150, in the case of reading data stored in the memory device 150. That is, after performing error correction decoding for data read from the memory device 150, the ECC unit 138 may determine whether the error correction decoding has succeeded, may output an indication signal depending on a determination result, for example, an error correction success/failure signal, and may correct an error bit of the read data by using the parity bits generated in the ECC encoding process. The ECC unit 138 cannot correct error bits when the number of occurred error bits is equal to or greater than a correctable error bit limit, and may output an error correction failure signal corresponding to the incapability of correcting error bits.

The ECC unit 138 may perform error correction by using, but is not limited to, an LDPC (low density parity check) code, a BCH (Bose, Chaudhuri, Hocquenghem) code, a turbo code, a Reed-Solomon code, a convolution code, an RSC (recursive systematic code), or a coded modulation such as a TCM (trellis-coded modulation) or a BCM (block coded modulation). The ECC unit 138 may include a circuit, a module, a system or a device for error correction.

The PMU 140 provides and manages power for the controller 130, that is, power for the components included in the controller 130.

The memory interface unit 142 serves as a memory/ storage interface which performs interfacing between the controller 130 and the memory device 150, to allow the controller 130 to control the memory device 150 in response to a request from the host 102. The memory interface unit 142 generates control signals for the memory device 150 and processes data according to the control of the processor 134, as a NAND flash controller (NFC) in the case where the memory device 150 is a flash memory, in particular, in the case where the memory device 150 is a NAND flash memory. The memory interface unit 142 may support the operation of an interface which processes a command and data between the controller 130 and the memory device 150, for example, a NAND flash interface, in particular, data input/output between the controller 130 and the memory device 150, and may be driven through a firmware referred to as a flash interface layer (FIL) being a region which exchanges data with the memory device 150.

The memory 144, as the working memory of the memory system 110 and the controller 130, stores data for driving of the memory system 110 and the controller 130. In detail, in the case where the controller 130 controls the memory device 150 in response to a request from the host 102, for example, in the case where the controller 130 provides the data read from the memory device 150, to the host 102, and stores the data provided from the host 102, in the memory device 150, and, to this end, in the case where the controller 130 controls the operations of the memory device 150, such as read, write, program and erase operations, the memory 144 stores data needed to allow such operations to be performed by the memory system 110, that is, between the controller 130 and the memory device 150.

The memory 144 may be realized by a volatile memory. For example, the memory 1441 may be realized by a static random access memory (SRAM) or a dynamic random access memory (DRAM). Furthermore, the memory 144 may exist inside the controller 130 as illustrated in FIG. 1. Alternatively, the memory 144 may exist outside the controller 130, and in this regard, may be implemented as an external volatile memory to and from which data are inputted and outputted from and to the controller 130 through a memory interface.

As described above, the memory 144 stores data needed to perform data read and write operations between the host 102 and the memory device 150 and data when performing the data read and write operations. For such data storage, the memory 144 includes a program memory, a data memory, a write buffer/cache, a read buffer/cache, a data buffer/cache, a map buffer/cache, and so forth.

The processor 134 controls the general operations of the memory system 110, and particularly, controls a program operation or a read operation for the memory device 150, in response to a write request or a read request from the host 102. The processor 134 drives firmware which is referred to as a flash translation layer (FTL), to control general operations of the memory system 110. The processor 134 may be implemented by a microprocessor or a central processing unit (CPU).

For instance, the controller 130 performs an operation requested from the host 102, in the memory device 150, that is, performs a command operation corresponding to a command received from the host 102, with the memory device 150, through the processor 134 implemented by a microprocessor or a central processing unit (CPU). The controller 130 may perform a foreground operation as a command operation corresponding to a command received from the host 102, for example, a program operation corresponding to a write command, a read operation corresponding to a read command, an erase operation corresponding to an erase command or a parameter set operation corresponding to a set parameter command or a set feature command as a set command.

The controller 130 may also perform a background operation for the memory device 150, through the processor 134 implemented by a microprocessor or a central processing unit (CPU). The background operation for the memory device 150 includes an operation of copying the data stored in a certain memory block among the memory blocks 152, 154, 156 and 180 of the memory device 150, to another certain memory block, for example, a garbage collection (GC) operation, an operation of swapping the memory blocks 152, 154, 156 and 180 of the memory device 150 or the data stored in the memory blocks 152, 154, 156 and 180, for example, a wear leveling (WL) operation, an operation of storing the map data stored in the controller 130, in the memory blocks 152, 154, 156 and 180 of the memory device 150, for example, a map flush operation, or an operation of performing bad block management for the memory device 150, for example, a bad block management operation of checking and processing a bad block in the plurality of memory blocks 152, 154, 156 and 180 included in the memory device 150.

Also, in a memory system in accordance with an embodiment of the present disclosure, for instance, in the case where the controller 130 performs a plurality of command operations corresponding to a plurality of commands received from the host 102, for example, a plurality of program operations corresponding to a plurality of write commands, a plurality of read operations corresponding to a plurality of read commands and a plurality of erase operations corresponding to a plurality of erase commands, in the memory device 150, best channels (or ways) are decided among a plurality of channels (or ways) coupled with a plurality of memory dies included in the memory device 150, the commands received from the host 102 are transmitted to corresponding memory dies through the best channels (or ways), performance results of the command operations are received through the best channels (or ways) from the memory dies in which the command operations corresponding to the commands are performed, and the performance results of the command operations are provided to the host 102. In particular, in the memory system in accordance with an embodiment of the present disclosure, in the case where a plurality of commands are received from the host 102, after checking the states of a plurality of channels (or ways) coupled with the memory dies of the memory device 150, best transmission channels (or transmission ways) are decided corresponding to the states of the channels (or ways), and the plurality of commands received from the host 102 are transmitted to corresponding memory dies through the best transmission channels (or transmission ways). Moreover, in the memory system in accordance with an embodiment of the present disclosure, after performing command operations corresponding to the plurality of commands received from the host 102, in the memory dies of the memory device 150, performance results of the command operations are received from the memory dies of the memory device 150 through best reception channels (or reception ways) corresponding to the states of channels (or ways) among the plurality of channels (or ways) coupled with the memory dies of the memory device 150. The performance results received from the memory dies of the memory device 150 are provided to the host 102 as responses to the plurality of commands received from the host 102.

After checking the states of the plurality of channels (or ways) coupled with the plurality of memory dies included in the memory device 150, for example, a busy state, a ready state, an active state, an idle state, a normal state or an abnormal state of the channels (or ways), the controller 130 transmits the plurality of commands received from the host 102, to the corresponding memory dies through the best channels (or ways) according to the states of the channels (or ways), that is, requests performing of the command operations corresponding to the plurality of commands received from the host 102, to the corresponding memory dies through the best transmission channels (or transmission ways). Corresponding to the request for performing of the command operations through the best transmission channels (or transmission ways), the controller 130 receives the performance results of the command operations from the corresponding memory dies. In this regard, the controller 130 receives the performance results of the command operations through the best channels (or ways) according to the states of the channels (or ways), that is, the best reception channels (or reception ways). The controller 130 matches the descriptors of the commands transmitted through the best transmission channels (or transmission ways) and the descriptors of the performance results received through the best reception channels (or reception ways), and then, provides the performance results of the command operations corresponding to the commands received from the host 102, to the host 102.

In the descriptors of the commands, there may be included data information or position information corresponding to the commands, for example, the addresses of data corresponding to write commands or read commands (for instance, logical page numbers of data) or the addresses of positions where data are stored (for instance, the physical page information of the memory device 150), etc. and indication information of transmission channels (or transmission ways) through which the commands are transmitted, for example, the identifiers (for example, channel numbers (or way numbers)) of the transmission channels (or the transmission ways), etc. In the descriptors of the performance results, there may be included data information or position information corresponding to the performance results, for example, the addresses for the data of program operations corresponding to write commands or the data of read operations corresponding to read commands (for instance, logical page numbers for data) or the addresses of positions where the program operations or the read operations are performed (for instance, the physical page information of the memory device 150), etc. and indication information of channels (or ways) through which command operations are requested, that is, transmission channels (or transmission ways) through which the commands are transmitted, for example, the identifiers (for example, channel numbers (or way numbers)) of the transmission channels (or the transmission ways), etc. The information included in the descriptors of the commands and the descriptors of the performance results, for example, the data information, the position information, or the indication information of the channels (or the ways), may be included in the descriptors in the form of contexts or tags.

That is, in the memory system 110 in accordance with an embodiment of the present disclosure, the plurality of commands received from the host 102 and the performance results of the plurality of command operations corresponding to the commands are transmitted and received through the best channels (or ways) among the plurality of channels (or ways) coupled with the memory dies of the memory device 150. In particular, in the memory system 110 in accordance with an embodiment of the present disclosure, in correspondence to the states of the plurality of channels (or ways) coupled with the memory dies of the memory device 150, the transmission channels (or transmission ways) through which the commands are to be transmitted to the memory dies of the memory device 150 and the reception channels (or reception ways) through which the performance results of the command operations are to be received from the memory dies of the memory device 150 are managed independently of each other. For example, the controller 130 in the memory system 110 decides a transmission channel (or transmission way) through which a first command is transmitted and a reception channel (or reception way) through which a performance result of a first command operation corresponding to the first command is received, as best channels (or ways) which are independent of each other, among the plurality of channels (or ways), in correspondence to the states of the plurality of channels (or ways). For instance, the transmission channel (or transmission way) is decided as a first best channel (or way) and the reception channel (or reception way) is decided as the first best channel (or way) or a second best channel (or way), and then, transmission of the first command and reception of the performance result of the first command operation are respectively performed through the best channels (or ways) which are independent of each other.

Therefore, in the memory system 110 in accordance with an embodiment of the present disclosure, the plurality of channels (or ways) coupled with the plurality of memory dies of the memory device 150 may be used efficiently. In particular, since the plurality of commands received from the host 102 and the performance results of the command operations corresponding to the commands are respectively transmitted and received through the best channels (or ways) which are independent of each other, the operational performance of the memory system 110 may be improved. While it will be described as an example in the embodiment of the present disclosure for the sake of convenience in description that the plurality of commands received from the host 102 and the performance results of the command operations corresponding to the commands are transmitted and received through the plurality of channels (or ways) for the memory dies included in the memory device 150 of the memory system 110, it is to be noted that the same principle may be applied even in the case where, in a plurality of memory systems each including the controller 130 and the memory device 150, a plurality of commands received from the host 102 and performance results after performing command operations corresponding to the commands in the respective memory systems are transmitted and received through a plurality of channels (or ways) for the respective memory systems.

Hereinbelow, a memory device in the memory system in accordance with the embodiment of the disclosure will be described in detail with reference to FIGS. 2 to 4.

Figure 2:
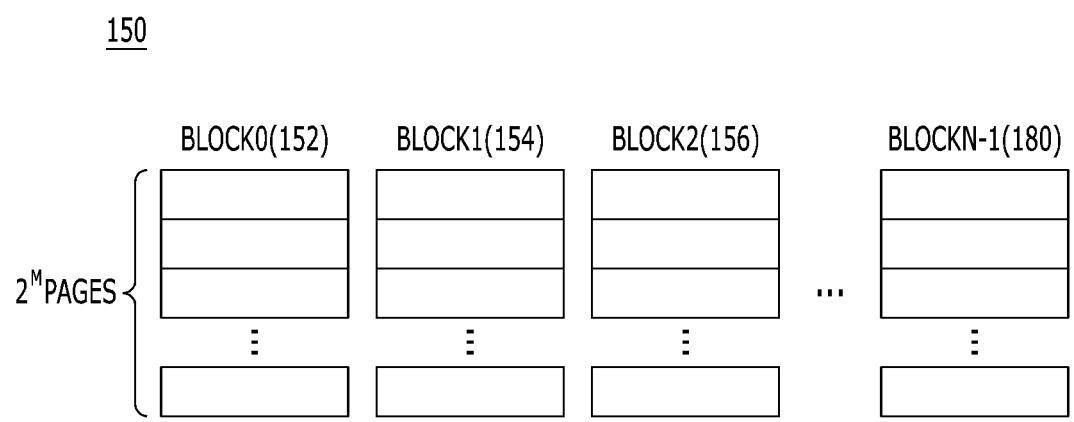
FIG. 2 is a diagram schematically illustrating an example of a memory device in accordance with an embodiment of the present disclosure.
Figure 3:
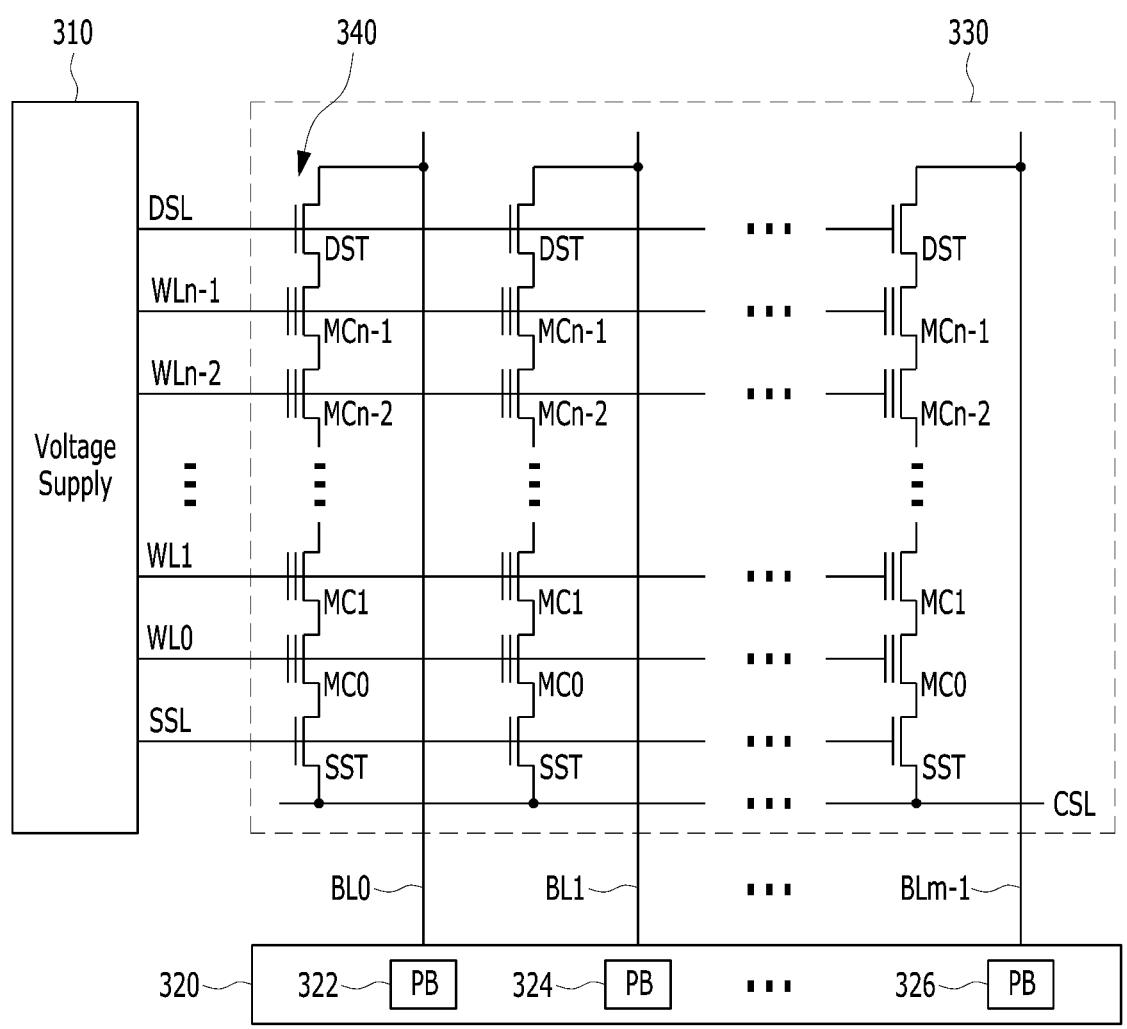
FIG. 3 is a diagram schematically illustrating a memory cell array circuit of memory blocks in the memory device in accordance with an embodiment of the disclosure.
Figure 4:
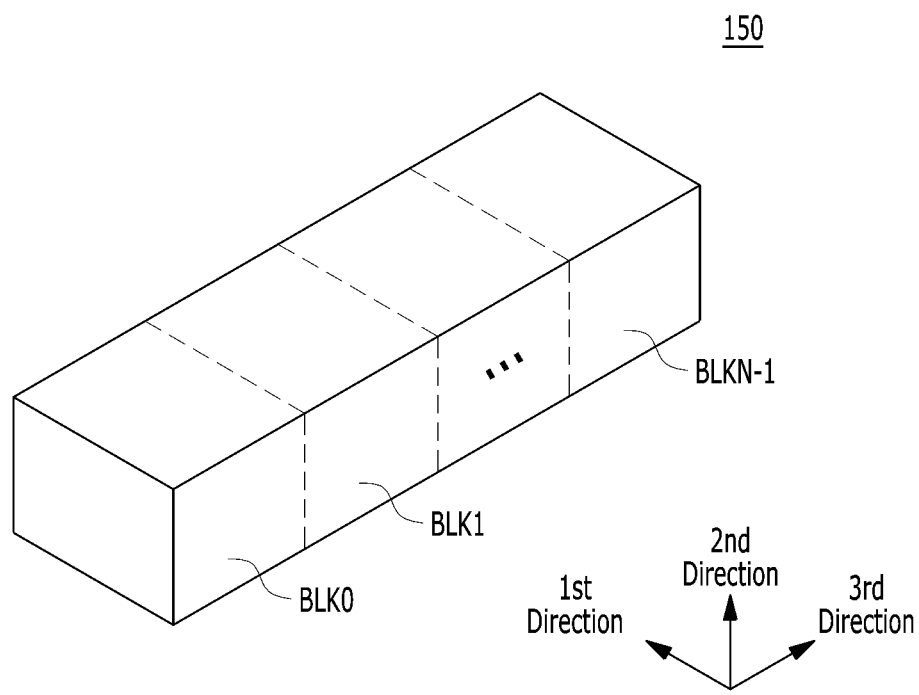
FIG. 4 is a diagram schematically illustrating a structure of the memory device in the memory system in accordance with an embodiment of the present disclosure, wherein a structure in a case where the memory device is implemented as a 3D nonvolatile memory device is schematically illustrated.

FIG. 2 is a diagram schematically illustrating an example of a memory device in accordance with an embodiment of the present disclosure, FIG. 3 is a diagram schematically illustrating a memory cell array circuit of memory blocks in the memory device in accordance with an embodiment of the disclosure, and FIG. 4 is a diagram schematically illustrating the structure of the memory device in the memory system in accordance with an embodiment of the present disclosure. FIG. 4 is a diagram schematically illustrating a structure in the case where the memory device is implemented as a 3-dimensional nonvolatile memory device.

First, referring to FIG. 2, the memory device 150 includes a plurality of memory blocks, for example, a zeroth block (BLOCK0) 152, a first block (BLOCK1) 154, a second block (BLOCK2) 156 and an $(N-1)^{th}$ block (BLOCKN-1) 180. Each of the blocks 152, 154, 156 and 180 includes a plurality of pages, for example, $2^M$ number of pages ($2^M$ PAGES). While it is described for the sake of convenience in description that each of the plurality of memory blocks includes $2^M$ number of pages, it is to be noted that each of the plurality of memory blocks may include M number of pages. Each of the pages includes a plurality of memory cells to which a plurality of word lines (WL) are coupled.

Also, depending on the number of bits capable of storing or expressing the plurality of memory blocks in one memory cell, the memory device 150 may include a single level cell (SLC) memory block including a plurality of pages realized by memory cells each storing 1-bit data, a multi-level cell (MLC) memory block including a plurality of pages realized by memory cells each capable of storing 2-bit data, a triple level cell (TLC) memory block including a plurality of pages realized by memory cells each capable of storing 3-bit data, a quadruple level cell (QLC) memory block including a plurality of pages realized by memory cells each capable of storing 4-bit data, a multiple level cell memory block including a plurality of pages implemented by memory cells each capable of storing 5 or more-bit data, or the like.

The memory device 150 may store a larger amount of data in the multiple level cell memory block than in the single level cell memory block. However, the memory device 150 may more quickly process data by using the single level cell memory block than by using the multiple level cell memory block. That is, the single level cell memory block and the multiple level cell memory block have different advantages and disadvantages from each other. Because of this fact, when rapid data processing is required, the processor 134 may control the memory device 150 such that the memory device 150 programs data to the single level cell memory block. On the other hand, when a large amount of storage space is required, the processor 134 may control the memory device 150 such that the memory device 150 programs data to the multiple level cell memory block. As a result, according to a situation, the processor 134 may decide the type of a memory block in which data is to be stored.

While it is described below as an example for the sake of convenience in description that the memory device 150 is implemented by a nonvolatile memory such as a flash memory, for example, a NAND flash memory, it is to be noted that the memory device 150 may be implemented as any memory among memories such as a phase change memory or phase change random access memory (PCRAM), a resistive memory (RRAM) or resistive random access memory (ReRAM), a ferroelectric memory or ferroelectric random access memory (FRAM) and a spin transfer torque magnetic memory (SU-RAM) or spin transfer torque magnetic random access memory (STT-MRAM).

Each of the memory blocks 152, 154, 156 and 180 stores the data provided from the host device 102, through a program operation, and provides stored data to the host 102, through a read operation.

Referring to FIG. 3, a plurality of memory blocks included in the memory device 150 of the memory system 110 may be implemented as a memory cell array 330, and thereby, may include a plurality of cell strings 340 which are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors DST and SST. The respective memory cells MC0 to MCn−1 may be configured by multi-level cells (MLC) each of which stores data information of a plurality of bits. The cell strings 340 may be electrically coupled to the corresponding bit lines BL0 to BLm−1, respectively.

While FIG. 3 illustrates, as an example, each memory cell array 330 which is configured by NAND flash memory cells, it is to be noted that the plurality of memory blocks included in the memory device 150 in accordance with an embodiment of the present disclosure are not limited to a NAND flash memory and may be implemented by a NOR flash memory, a hybrid flash memory in which at least two types of memory cells are combined or a one-NAND flash memory in which a controller is built in a memory chip.

A voltage supply 310 of the memory device 150 may provide word line voltages (for example, a program voltage, a read voltage and a pass voltage) to be supplied to respective word lines depending on an operation mode and a voltage to be supplied to a bulk (for example, a well region) where memory cells are formed. The voltage generating operation of the voltage supply 310 may be performed under the control of a control circuit (not illustrated). The voltage supply 310 may generate a plurality of variable read voltages to generate a plurality of read data, select one among the memory blocks (or sectors) of a memory cell array in response to the control of the control circuit, select one among the word lines of the selected memory block, and provide word line voltages to the selected word line and unselected word lines.

A read/write circuit 320 of the memory device 150 is controlled by the control circuit, and may operate as a sense amplifier or a write driver according to an operation mode. For example, in the case of a verify/normal read operation, the read/write circuit 320 may operate as a sense amplifier for reading data from the memory cell array. Also, in the case of a program operation, the read/write circuit 320 may operate as a write driver which drives bit lines according to data to be stored in the memory cell array. In the program operation, the read/write circuit 320 may receive data to be written in the memory cell array, from a buffer (not illustrated), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not illustrated) may be included in each of the page buffers 322, 324 and 326.

Also, the memory device 150 may be implemented as a two-dimensional or three-dimensional memory device. In particular, as illustrated in FIG. 4, the memory device 150 may be implemented as a nonvolatile memory device with a three-dimensional stack structure. In the case where the memory device 150 is implemented as a three-dimensional structure, the memory device 150 may include a plurality of memory blocks BLK0 to BLKN−1. FIG. 4 is a block diagram illustrating the memory blocks of the memory device 150 illustrated in FIG. 1, and each of the memory blocks may be implemented as a three-dimensional structure (or a vertical structure). For example, the respective memory blocks may be implemented as a three-dimensional structure by including a structure which extends in first to third directions, for example, an x-axis direction, a y-axis direction and a z-axis direction.

Each memory cell array 330 included in the memory device 150 may include a plurality of NAND strings NS which extend in the second direction. The plurality of NAND strings NS may be provided in the first direction and the third direction. Each NAND string NS may be coupled to a bit line BL, at least one string select line SSL, at least one ground select line GSL, a plurality of word lines WL, at least one dummy word line DWL and a common source line CSL, and may include a plurality of transistor structures TS.

Namely, among the plurality of memory blocks of the memory device 150, each memory cell array 330 may be coupled to a plurality of bit lines BL, a plurality of string select lines SSL, a plurality of ground select lines GSL, a plurality of word lines WL, a plurality of dummy word lines DWL and a plurality of common source lines CSL, and accordingly, may include a plurality of NAND strings NS. Also, in each memory cell array 330, a plurality of NAND strings NS may be coupled to one bit line BL, and thereby, a plurality of transistors may be implemented in one NAND string NS. The string select transistor SST of each NAND string NS may be coupled with a corresponding bit line BL, and the ground select transistor GST of each NAND string NS may be coupled with the common source line CSL. Memory cells MC may be provided between the string select transistor SST and the ground select transistor GST of each NAND string NS. Namely, in each memory cell array 330 of the plurality of memory blocks of the memory device 150, a plurality of memory cells may be implemented.

Figure 5:
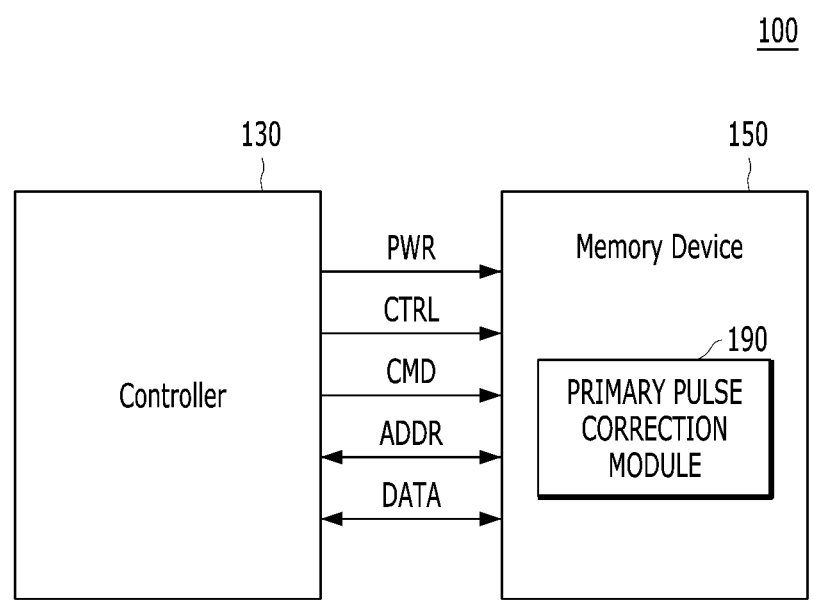
FIG. 5 is a diagram illustrating a memory system in accordance with an embodiment of the present disclosure.

FIG. 5 is a diagram illustrating a memory system in accordance with an embodiment of the present disclosure. Referring to FIG. 5, the memory system 100 may include a memory device 150 and a controller 130.

The memory device 150 may perform erase, write and read operations under the control of the controller 130. The memory device 150 may receive a command CMD, an address ADDR and data DATA from the controller 130 through input/output lines. Also, the memory device 150 may receive power PWR from the controller 130 through a power line, and may receive a control signal CTRL from the controller 130 through a control line. The control signal CTRL may include a data strobe signal (DQS), a command latch enable signal (CLE), an address latch enable signal (ALE), a chip enable signal (CE), a write enable signal (WE), a read enable signal (RE), and so forth.

The memory device 150 may include a primary pulse correction module 190. The primary pulse correction module 190 may detect an abnormality in the duty ratio of a primary pulse of the data strobe signal (DQS) or the read enable signal (RE), and may correct the duty ratio of the primary pulse. Detailed description of the primary pulse correction module 190 will be made below with reference to FIGS. 6 to 14.

Figure 6:
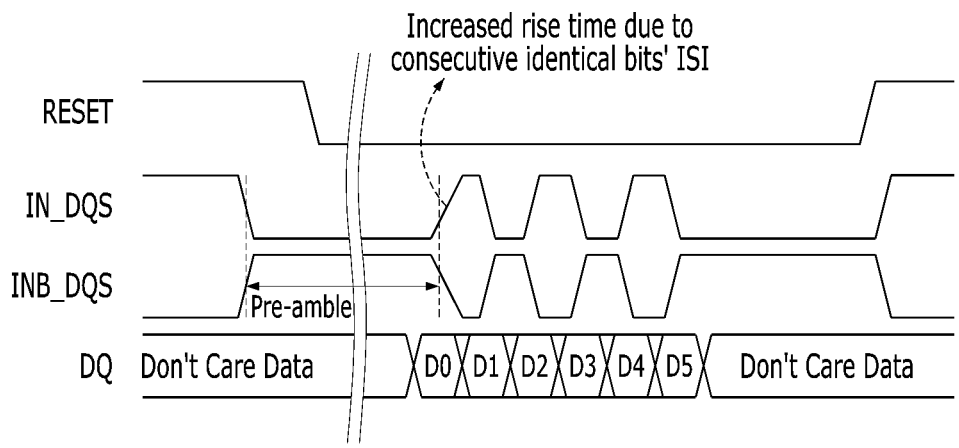
FIG. 6 is a timing diagram of a data strobe signal or a read enable signal in accordance with an embodiment of the present disclosure.

FIG. 6 is a timing diagram of a data strobe signal or a read enable signal in accordance with an embodiment of the present disclosure. A period in which a logic low level state continues after the value of a data strobe signal IN_DQS is changed to a logic low level is a preamble period. When the logic low level state ends and is changed to a logic high level for the first time, that is, when the preamble period ends, a time required for the value of the data strobe signal IN_DQS to become a logic high level increases as compared to that in a normal toggling state, due to the influence of the continued logic low level state. Therefore, the memory device 150 may not recognize the data strobe signal IN_DQS in a timely manner, and a case in which data has to be read again may occur.

Figure 7:
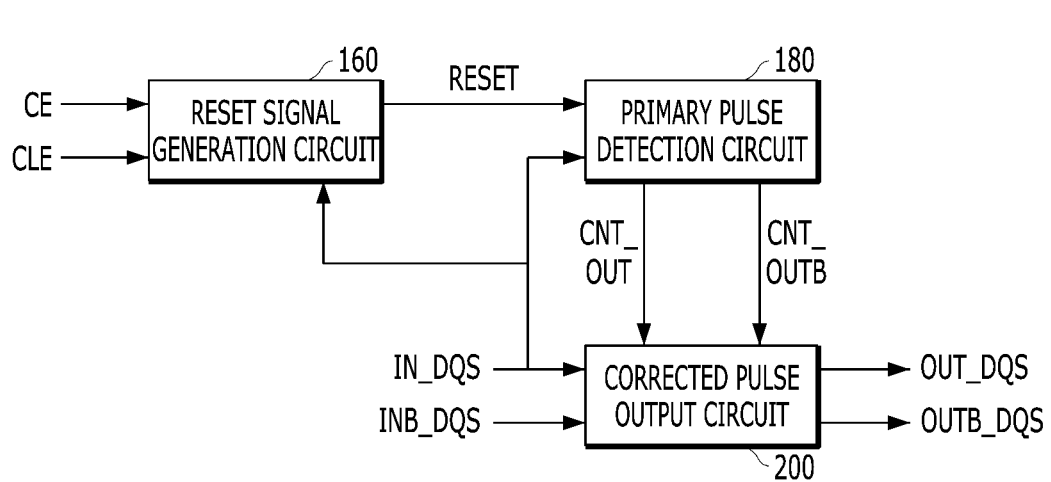
FIG. 7 is a diagram illustrating blocks configuring a primary pulse correction module in accordance with an embodiment of the present disclosure.

FIG. 7 is a diagram illustrating blocks configuring the primary pulse correction module in accordance with an embodiment of the present disclosure. Referring to FIG. 7, the primary pulse correction module 190 may include a reset signal generation circuit 160, a primary pulse detection circuit 180 and a corrected primary pulse output circuit 200.

The reset signal generation circuit 160 may receive a chip enable signal CE, a command latch enable signal CLE and a data strobe signal IN_DQS or a read enable signal RE, may generate a reset signal RESET on the basis of the received data strobe signal IN_DQS or read enable signal RE, chip enable signal CE and command latch enable signal CLE, and may transmit the reset signal RESET to the primary pulse detection circuit 180. The reset signal RESET may have the value of a logic low level or a logic high level.

The reset signal generation circuit 160 may generate the reset signal RESET by detecting the start of a preamble period, that is, the start of a period in which a logic low level of a data strobe signal DQS or a read enable signal RE continues after the data strobe signal DQS or the read enable signal RE is changed to the logic low level, and the end of a postamble period, that is, the end of a period in which a logic low level of the data strobe signal DQS or the read enable signal RE continues after the data strobe signal DQS or the read enable signal RE is toggled. In an embodiment of the present disclosure, the reset signal generation circuit 160 may generate the reset signal RESET which has the value of a logic low level, by detecting the start of the preamble period, and generate the reset signal RESET which has the value of a logic high level, by detecting the end of the postamble period, but embodiments of the present disclosure are not limited thereto.

The primary pulse detection circuit 180 may receive the reset signal RESET generated by the reset signal generation circuit 160 and the data strobe signal IN_DQS or the read enable signal RE, and may output corrected primary pulse output circuit control signals CNT_OUT and CNT_OUTB. The corrected primary pulse output circuit control signals CNT_OUT and CNT_OUTB may include a first corrected primary pulse output circuit control signal CNT_OUT and a second corrected primary pulse output circuit control signal CNT_OUTB. When the reset signal RESET received from the reset signal generation circuit 160 is a logic high level, the corrected primary pulse output circuit control signals CNT_OUT and CNT_OUTB, which are output values of the primary pulse detection circuit 180, may be reset to a logic low level and a logic high level, respectively. That is, the first corrected primary pulse output circuit control signal CNT_OUT may be reset to a logic low level, and the second corrected primary pulse output circuit control signal CNT_OUTB may be reset to a logic high level.

When the reset signal RESET becomes a logic low level, the primary pulse detection circuit 180 may detect that the data strobe signal IN_DQS or the read enable signal RE transitions from a logic low level to a logic high level at the end of the preamble period, and thereby, may change the values of the corrected primary pulse output circuit control signals CNT_OUT and CNT_OUTB and output changed values of the corrected primary pulse output circuit control signals CNT_OUT and CNT_OUTB. For example, the primary pulse detection circuit 180 may change the value of the first corrected primary pulse output circuit control signal CNT_OUT from a logic low level to a logic high level, and may change the value of the second corrected primary pulse output circuit control signal CNT_OUTB from a logic high level to a logic low level.

The corrected primary pulse output unit 200 may receive the data strobe signal IN_DQS or the read enable signal RE, and may output the data strobe signal IN_DQS or the read enable signal RE in which the duty ratio of a primary pulse is corrected on the basis of the corrected primary pulse output circuit control signals CNT_OUT and CNT_OUTB received from the primary pulse detection circuit 180. That is, the corrected primary pulse output circuit 200 may correct the duty ratio of the primary pulse of the data strobe signal IN_DQS or the read enable signal RE to be outputted, by adjusting the rising edge of the received data strobe signal IN_DQS or read enable signal RE immediately after the end of the preamble period, thereby controlling the duty ratio of the primary pulse of the data strobe signal IN_DQS or the read enable signal RE so that the duty ratio of the primary pulse of the data strobe signal IN_DQS or the read enable signal RE is the same as or similar to the duty ratio of a subsequent and normal pulse of the data strobe signal IN_DQS or the read enable signal RE. In this disclosure, a primary pulse of the data strobe signal IN_DQS or the read enable signal RE is a pulse thereof immediately after the end of the preamble period. In this disclosure, a subsequent pulse is a pulse subsequent to the primary pulse.

Figure 8:
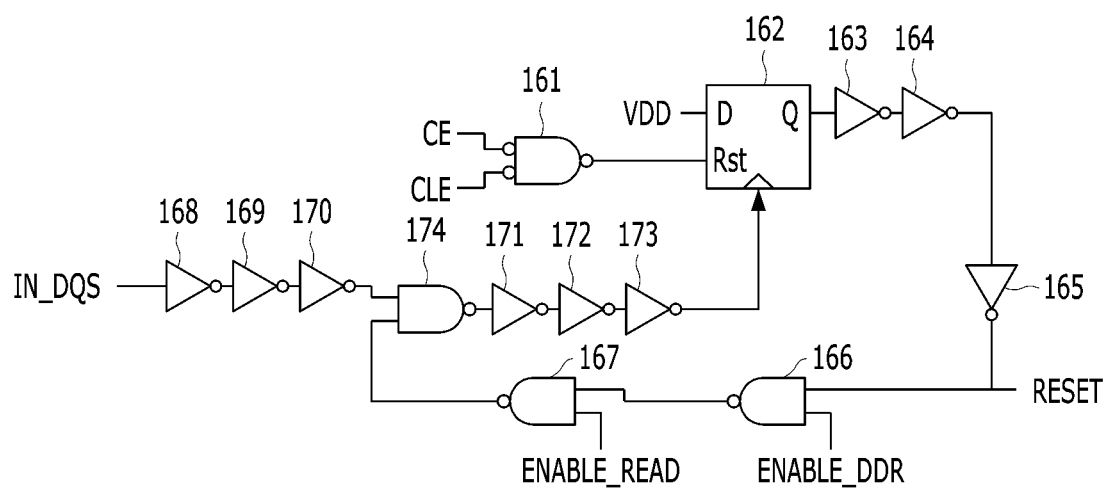
FIG. 8 is a diagram illustrating a reset signal generation circuit in accordance with an embodiment of the present disclosure.
Figure 9:
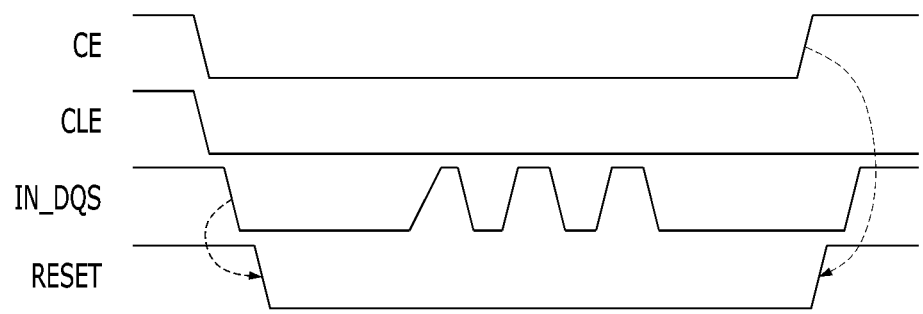
FIG. 9 is a timing diagram of signals inputted to and outputted from the reset signal generation circuit in accordance with an embodiment of the present disclosure.

FIG. 8 is a diagram illustrating the reset signal generation circuit 160 in accordance with an embodiment of the present disclosure, and FIG. 9 is a timing diagram of signals inputted to and outputted from the reset signal generation circuit 160 in accordance with an embodiment of the present disclosure.

Referring to FIG. 8, the reset signal generation circuit 160 may include a plurality of NAND gates 161, 166, 167 and 174, a plurality of inverters 163, 164, 165, 168, 169, 170, 171, 172 and 173, and a D flip-flop 162. The plurality of NAND gates 161, 166, 167 and 174 may include a first NAND gate 161, a second NAND gate 166, a third NAND gate 167 and a fourth NAND gate 174, and the plurality of inverters 163, 164, 165, 168, 169, 170, 171, 172 and 173 may include a first inverter 168, a second inverter 169, a third inverter 170, a fourth inverter 171, a fifth inverter 172, a sixth inverter 173, a seventh inverter 163, an eighth inverter 164 and a ninth inverter 165.

The first NAND gate 161 may receive an inverted signal of the chip enable signal CE and an inverted signal of the command latch enable signal CLE, and the output of the first NAND gate 161 may be coupled to a reset signal input terminal Rst of the D flip-flop 162.

The D flip-flop 162 may include an input terminal D, an output terminal Q, the reset signal input terminal Rst and a clock input terminal. The D flip-flop 162 may output a value, inputted to the input terminal D, to the output terminal Q at a rising edge of a clock inputted to the clock input terminal, and may maintain a previous value of the output terminal as it is at a falling edge of the clock inputted to the clock input terminal. The input terminal D of the D flip-flop 162 may be coupled to positive supply power VDD, the output terminal Q of the D flip-flop 162 may be coupled to the input of the seventh inverter 163, the output of the seventh inverter 163 may be coupled to the input of the eighth inverter 164, and the output of the eighth inverter 164 may be coupled to the input of the ninth inverter 165.

The ninth inverter 165 may output the reset signal RESET to be transmitted to the primary pulse detection circuit 180, and the reset signal RESET outputted by the ninth inverter 165 may be inputted to the second NAND gate 166. The second NAND gate 166 may receive the reset signal RESET outputted by the ninth inverter 165 and an enable DDR signal ENABLE_DDR, and may transfer an output to the third NAND gate 167. The third NAND gate 167 may receive a signal outputted by the second NAND gate 166 and an enable read signal ENABLE_READ, and may transfer an output thereof to the fourth NAND gate 174. The enable DDR signal ENABLE_DDR is a signal of a DC component which operates a DDR mode, and the enable read signal ENABLE_READ is a signal of a DC component which enables a read mode. Furthermore, not only the enable read signal ENABLE_READ but also an enable write signal ENABLE_WRITE of a DC component which enables a write mode may be used. Namely, the present disclosure may be used not only when data is read but also when data is written.

The fourth NAND gate 174 may receive the output of the third NAND gate 167 and an output of the third inverter 170, and the third inverter 170 may be coupled in series to the second inverter 169 and the first inverter 168. The first inverter 168 may receive the data strobe signal IN_DQS or the read enable signal RE. The fourth NAND gate 174 may be coupled to the fourth inverter 171, the fifth inverter 172 and the sixth inverter 173 which are coupled in series, and the output of the sixth inverter 173 may be coupled to the clock input terminal of the D flip-flop 162.

When a value of the data strobe signal IN_DQS having a logic high level is inputted to the first inverter 168, the third inverter 170 may output a logic low level.

A value initially outputted by the output terminal Q of the D flip-flop 162 may be a logic low level, and as a value outputted through the seventh inverter 163, the eighth inverter 164 and the ninth inverter 165 becomes a logic high level, the reset signal RESET may become a logic high level. When both the enable DDR signal ENABLE_DDR and the enable read signal ENABLE_READ are logic high levels, a value outputted by the second NAND gate 166 may become a logic low level, and a value outputted by the third NAND gate 167 may become a logic high level.

The fourth NAND gate 174 may receive a logic low level outputted by the third inverter 170 and a logic high level outputted by the third NAND gate 167, may output a logic high level, and may transfer the logic high level to the fourth inverter 171. Finally, the sixth inverter 173 may output a logic low level and transfer the logic low level to the clock input terminal of the D flip-flop 162, and the value outputted by the D flip-flop 162 is not changed.

When the preamble period starts and the value of the data strobe signal IN_DQS is changed to a logic low level, the data strobe signal IN_DQS becomes a logic high level through the first inverter 168, the second inverter 169 and the third inverter 170. The fourth NAND gate 174 receives a logic high level outputted by the third inverter 170 and a logic high level outputted by the third NAND gate 167, and outputs a logic low level to the fourth inverter 171. A logic high level outputted by the sixth inverter 173 is inputted to the clock input terminal of the D flip-flop 162. In the D flip-flop 162, a value of the input terminal D is outputted to the output terminal Q at a rising edge of the clock. Thus, when a value inputted to the clock input terminal is changed from a logic low level to a logic high level, the output of the output terminal Q of the D flip-flop 162 is changed to 1 being the value of the input terminal D. This value is inverted through the seventh inverter 163 to the ninth inverter 165, and thus, the reset signal RESET outputted from the ninth inverter 165 is changed to a logic low level.

When the reset signal RESET is changed to a logic low level, a logic low level is inputted to the clock input terminal of the D flip-flop 162, and thus, a value outputted by the output terminal Q of the D flip-flop 162 is not changed, and accordingly, the reset signal RESET may be continuously maintained.

Since the chip enable signal CE and the command latch enable signal CLE are inputted to the first NAND gate 161 by being inverted, the first NAND gate 161 operates like an OR gate. Accordingly, when any signal of the chip enable signal CE and the command latch enable signal CLE is a logic high level, a logic high level may be transferred to the reset signal input terminal Rst of the D flip-flop 162.

When the chip enable signal CE having a logic high level is transferred to the reset signal input terminal Rst of the D flip-flop 162, the value of the output terminal Q is reset to a logic low level, and thus, the reset signal RESET may also be changed to a logic high level.

Referring to FIG. 9, when the preamble period starts as the data strobe signal IN_DQS becomes a logic low level after both the chip enable signal CE and the command latch enable signal CLE become logic low levels, the reset signal generation circuit 160 may change the logic level of the reset signal RESET from a logic high level to a logic low level. When the chip enable signal CE is changed from a logic low level to a logic high level, the reset signal generation circuit 160 may change the reset signal RESET from a logic low level to a logic high level.

Figure 10:
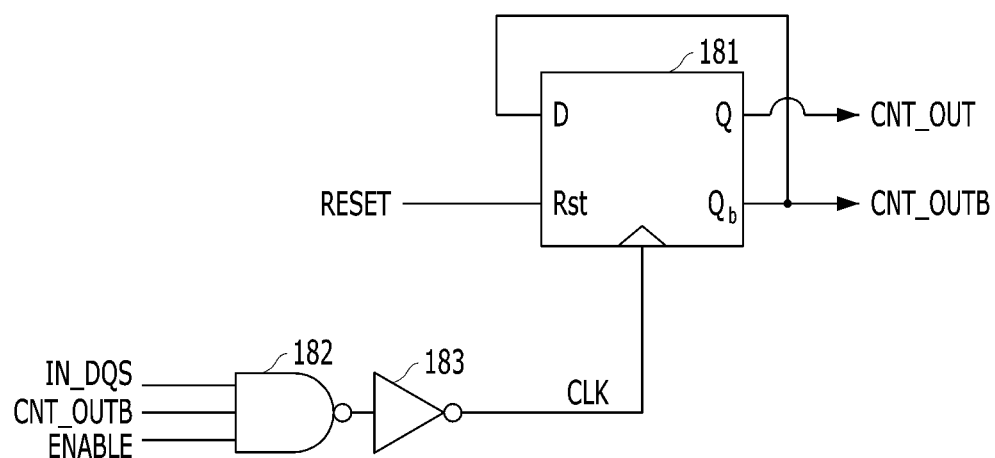
FIG. 10 is a diagram illustrating a primary pulse detection circuit in accordance with an embodiment of the present disclosure.

FIG. 10 is a diagram illustrating the primary pulse detection circuit 180 in accordance with an embodiment of the present disclosure. Referring to FIG. 10, the primary pulse detection circuit 180 may include a NAND gate 182, an inverter 183 and a D flip-flop 181.

The NAND gate 182 may receive the data strobe signal IN_DQS, the second corrected primary pulse output circuit control signal CNT_OUTB and an enable signal ENABLE. The output of the NAND gate 182 may be coupled to the input of the inverter 183, and the output of the inverter 183 may be coupled to a clock input terminal of the D flip-flop 181. The second corrected primary pulse output circuit control signal CNT_OUTB may control the corrected primary pulse output circuit 200 to correct the duty ratio of the primary pulse of the data strobe signal IN_DQS.

The D flip-flop 181 may include an input terminal D, a reset signal input terminal Rst, a first output terminal Q, and a second output terminal Qb. A value outputted from the second output terminal Qb may be inputted to the input terminal D by being fed back. The reset signal input terminal Rst may receive the reset signal RESET generated by the reset signal generation circuit 160, and the first output terminal Q and the second output terminal Qb may output the first corrected primary pulse output circuit control signal CNT_OUT and the second corrected primary pulse output circuit control signal CNT_OUTB, respectively. The second corrected primary pulse output circuit control signal CNT_OUTB may be an inverted signal of the first corrected primary pulse output circuit control signal CNT_OUT.

Since a logic low level is applied to the reset signal input terminal Rst of the D flip-flop 181 and an initial output value of the D flip-flop 181 is a logic low level, the first corrected primary pulse output circuit control signal CNT_OUT outputted from the first output terminal Q may become a logic low level, and the second corrected primary pulse output circuit control signal CNT_OUTB outputted from the second output terminal Qb may become a logic high level. When the data strobe signal IN_DQS having a logic low level, the second corrected primary pulse output circuit control signal CNT_OUTB having a logic high level and the enable signal ENABLE having a logic high level are applied to the NAND gate 182, the NAND gate 182 outputs a logic high level. This value is inverted by the inverter 183, a logic low level is applied to the D flip-flop 181, and thus, the output value of the D flip-flop 181 is not changed.

When the preamble period ends and the data strobe signal IN_DQS is changed to a logic high level for the first time, the data strobe signal IN_DQS, the second corrected primary pulse output circuit control signal CNT_OUTB and the enable signal ENABLE having logic high levels may be applied to the NAND gate 182. The NAND gate 182 may output a logic low level, and the inverter 183 may transfer a logic high level, obtained by inverting the logic low level, to the clock input terminal of the D flip-flop 181.

At a moment the value of a logic high level is applied to the clock input terminal of the D flip-flop 181, a logic high level being a value of the second corrected primary pulse output circuit control signal CNT_OUTB having been applied to the input terminal D may be outputted as the first corrected primary pulse output circuit control signal CNT_OUT from the first output terminal Q, and the second corrected primary pulse output circuit control signal CNT_OUTB having a logic low level may be outputted from the second output terminal Qb.

When the second corrected primary pulse output circuit control signal CNT_OUTB becomes a logic low level, a value outputted by the NAND gate 182 becomes a logic high level and a value outputted by the inverter 183 becomes a logic low level regardless of the value of the data strobe signal IN_DQS and the value of the enable signal ENABLE. Thus, a logic low level may be applied to the clock input terminal of the D flip-flop 181, and the values of the first corrected primary pulse output circuit control signal CNT_OUT and the second corrected primary pulse output circuit control signal CNT_OUTB may be maintained until the reset signal RESET having the value of a logic high level generated by the reset signal generation circuit 160 is applied.

When the reset signal RESET generated by the reset signal generation circuit 160 becomes a logic high level, the first corrected primary pulse output circuit control signal CNT_OUT may become a logic low level, and the second corrected primary pulse output circuit control signal CNT_OUTB may become a logic high level.

Figure 11:
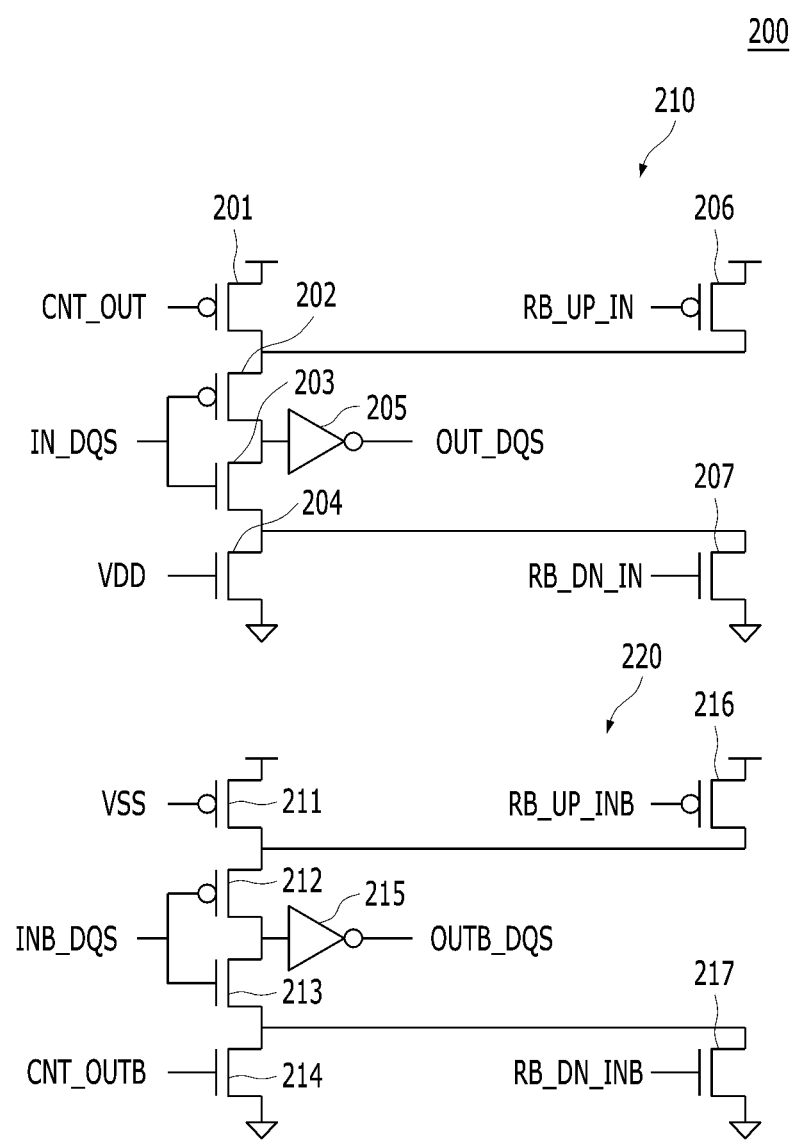
FIG. 11 is a diagram illustrating a corrected primary pulse output circuit in accordance with an embodiment of the present disclosure.

FIG. 11 is a diagram illustrating the corrected primary pulse output circuit 200 in accordance with an embodiment of the present disclosure. Referring to FIG. 11, the corrected primary pulse output circuit 200 may include a first corrected primary pulse output circuit 210 which outputs a first corrected primary pulse and a second corrected primary pulse output circuit 220 which outputs a second corrected primary pulse.

The first corrected primary pulse output circuit 210 may output a first corrected primary pulse OUT_DQS whose duty is corrected according to the first corrected primary pulse output circuit control signal CNT_OUT, and the second corrected primary pulse output circuit 220 may output a second corrected primary pulse OUTB_DQS whose duty is corrected according to the second corrected primary pulse output circuit control signal CNT_OUTB and which is a signal obtained as a data strobe signal is inverted. That is, the first corrected primary pulse OUT_DQS and the second corrected primary pulse OUTB_DQS have an inverted relationship.

In an embodiment of the present disclosure, the first corrected primary pulse output circuit 210 may include a first PMOS transistor 201, a second PMOS transistor 202, a third PMOS transistor 206, a first NMOS transistor 203, a second NMOS transistor 204, a third NMOS transistor 207 and an inverter 205.

The source of the first PMOS transistor 201 may be coupled to a positive supply voltage VDD, the drain of the first PMOS transistor 201 may be coupled to the source of the second PMOS transistor 202, and the drain of the first PMOS transistor 201 and the source of the second PMOS transistor 202 may be coupled to the drain of the third PMOS transistor 206.

The drain of the second PMOS transistor 202 may be coupled to the drain of the first NMOS transistor 203, the source of the first NMOS transistor 203 may be coupled to the drain of the second NMOS transistor 204, and the source of the second NMOS transistor 204 may be coupled to the ground. The source of the first NMOS transistor 203 and the drain of the second NMOS transistor 204 may be coupled to the drain of the third NMOS transistor 207.

The input of the inverter 205 may be coupled to the drain of the second PMOS transistor 202 and the drain of the first NMOS transistor 203.

The first corrected primary pulse output circuit control signal CNT_OUT may be applied to the gate of the first PMOS transistor 201, the data strobe signal IN_DQS may be applied to the gate of the second PMOS transistor 202 and the gate of the first NMOS transistor 203, the positive supply voltage VDD may be applied to the gate of the second NMOS transistor 204, a primary pulse falling edge correction signal RB_UP_IN may be applied to the gate of the third PMOS transistor 206, and a primary pulse rising edge correction signal RB_DN_IN may be applied to the gate of the third NMOS transistor 207. The inverter 205 may output the first corrected primary pulse OUT_DQS, that is, a duty-corrected data strobe signal.

The second corrected primary pulse output circuit 220 may include a first PMOS transistor 211, a second PMOS transistor 212, a third PMOS transistor 216, a first NMOS transistor 213, a second NMOS transistor 214, a third NMOS transistor 217 and an inverter 215.

The source of the first PMOS transistor 211 may be coupled to the positive supply voltage VDD, the drain of the first PMOS transistor 211 may be coupled to the source of the second PMOS transistor 212, and the drain of the first PMOS transistor 211 and the source of the second PMOS transistor 212 may be coupled to the drain of the third PMOS transistor 216.

The drain of the second PMOS transistor 212 may be coupled to the drain of the first NMOS transistor 213, the source of the first NMOS transistor 213 may be coupled to the drain of the second NMOS transistor 214, and the source of the second NMOS transistor 214 may be coupled to the ground. The source of the first NMOS transistor 213 and the drain of the second NMOS transistor 214 may be coupled to the drain of the third NMOS transistor 217.

The input of the inverter 215 may be coupled to the drain of the second PMOS transistor 212 and the drain of the first NMOS transistor 213.

A negative supply voltage VSS may be applied to the gate of the first PMOS transistor 211, an inverted data strobe signal INB_DQB may be applied to the gate of the second PMOS transistor 212 and the gate of the first NMOS transistor 213, the second corrected primary pulse output circuit control signal CNT_OUTB may be applied to the gate of the second NMOS transistor 214, a second pulse falling edge correction signal RB_UP_INB may be applied to the gate of the third PMOS transistor 216, and a second pulse rising edge correction signal RB_DN_INB may be applied to the gate of the third NMOS transistor 217. The inverter 215 may output the second corrected primary pulse OUTB_DQS, that is, a duty-corrected data strobe signal.

As an example, the first corrected primary pulse output circuit control signal CNT_OUT applied to the first PMOS transistor 201 of the first corrected primary pulse output circuit 210 has a logic low level and the second corrected primary pulse output circuit control signal CNT_OUTB applied to the second NMOS transistor 214 of the second corrected primary pulse output circuit 220 has a logic high level. The first PMOS transistor 210 of the first corrected primary pulse output circuit 210 may be turned on since the first corrected primary pulse output circuit control signal CNT_OUT is a logic low level, and the second NMOS transistor 214 of the second corrected primary pulse output circuit 220 may be turned on since the second corrected primary pulse output circuit control signal CNT_OUTB is a logic high level.

The second NMOS transistor 204 of the first corrected primary pulse output circuit 210 may always maintain a turn-on state as the positive supply voltage VDD is applied to the gate thereof, and the first PMOS transistor 211 of the second corrected primary pulse output circuit 220 may always maintain a turn-on state as the negative supply voltage VSS is applied to the gate thereof.

The primary pulse falling edge correction signal RB_UP_IN having a logic low level may be applied to the gate of the third PMOS transistor 206 of the first corrected primary pulse output circuit 210, and the primary pulse rising edge correction signal RB_DN_IN having a logic high signal may be applied to the third NMOS transistor 207 of the first corrected primary pulse output circuit 210.

The second pulse falling edge correction signal RB_UP_INB having a logic low level may be applied to the gate of the third PMOS transistor 216 of the second corrected primary pulse output circuit 220, and the second pulse rising edge correction signal RB_DN_INB having a logic high signal may be applied to the third NMOS transistor 217 of the second corrected primary pulse output circuit 220.

When, in this state, the data strobe signal IN_DQS inputted to the first corrected primary pulse output circuit 210 rises from a logic low level to a logic high level, the second PMOS transistor 202 is turned off, the first NMOS transistor 203 is turned on, a logic low level is applied to the input of the inverter 205, and the output of the inverter 205 is changed from a logic low level to a logic high level.

At this time, since both the second NMOS transistor 204 and the third NMOS transistor 207 are in a turn-on state, the output of the inverter 205 may quickly reach a logic high level. That is, the third NMOS transistor 207 which is controlled by the primary pulse rising edge correction signal RB_DN_IN may adjust the rising edge of a pulse signal outputted from the inverter 205 and thereby correct the duty ratio of the pulse signal.

When the second corrected primary pulse output circuit control signal CNT_OUTB applied to the second NMOS transistor 214 of the second corrected primary pulse output circuit 220 is a logic high level, the second NMOS transistor 214 may be turned on.

The first PMOS transistor 211 of the second corrected primary pulse output circuit 220 may always maintain a turn-on state as the negative supply voltage VSS is applied to the gate thereof, the third NMOS transistor 217 of the second corrected primary pulse output circuit 220 may be turned on as the second pulse rising edge correction signal RB_DN_INB of a logic high level is applied to the gate thereof, and the third PMOS transistor 216 of the second corrected primary pulse output circuit 220 may be turned on as the second pulse falling edge correction signal RB_UP_INB of a logic low level is applied to the gate thereof.

In this state, when a signal INB_DQS which is generated as the data strobe signal IN_DQS is inverted falls from a logic high level to a logic low level, the first NMOS transistor 213 is turned off, the second PMOS transistor 212 is turned on, a logic high level is applied to the input of the inverter 215, and the output of the inverter 215 is changed from a logic high level to a logic low level.

At this time, since both the first PMOS transistor 211 and the third PMOS transistor 216 are in a turn-on state, the output of the inverter 215 may quickly reach a logic low level. Namely, the third PMOS transistor 216 which is controlled by the second pulse falling edge correction signal RB_UP_INB may adjust the falling edge of a pulse signal outputted from the inverter 215 and thereby correct the duty ratio of the pulse signal.

When the data strobe signal IN_DQS falls from a logic high level to a logic low level again, the first NMOS transistor 203 may be turned off, and the second PMOS transistor 202 may be turned on. At this time point, the first corrected primary pulse output circuit control signal CNT_OUT is changed from a logic low level to a logic high level, and thus, the first PMOS transistor 201 is turned off. Since only the rising edge of the data strobe signal IN_DQS needs to be corrected, the first PMOS transistor 201 is controlled to be turned off as the first corrected primary pulse output circuit control signal CNT_OUT becomes a logic high level. The second corrected primary pulse output circuit control signal CNT_OUTB applied to the second NMOS transistor 214 of the second corrected primary pulse output circuit 220 is controlled in the same manner.

Although embodiments of the present disclosure have been described with respect to the data strobe signal IN_DQS, it goes without saying that the present disclosure can be applied to not only the read enable signal RE but also other memory device control signals.

Figure 12:
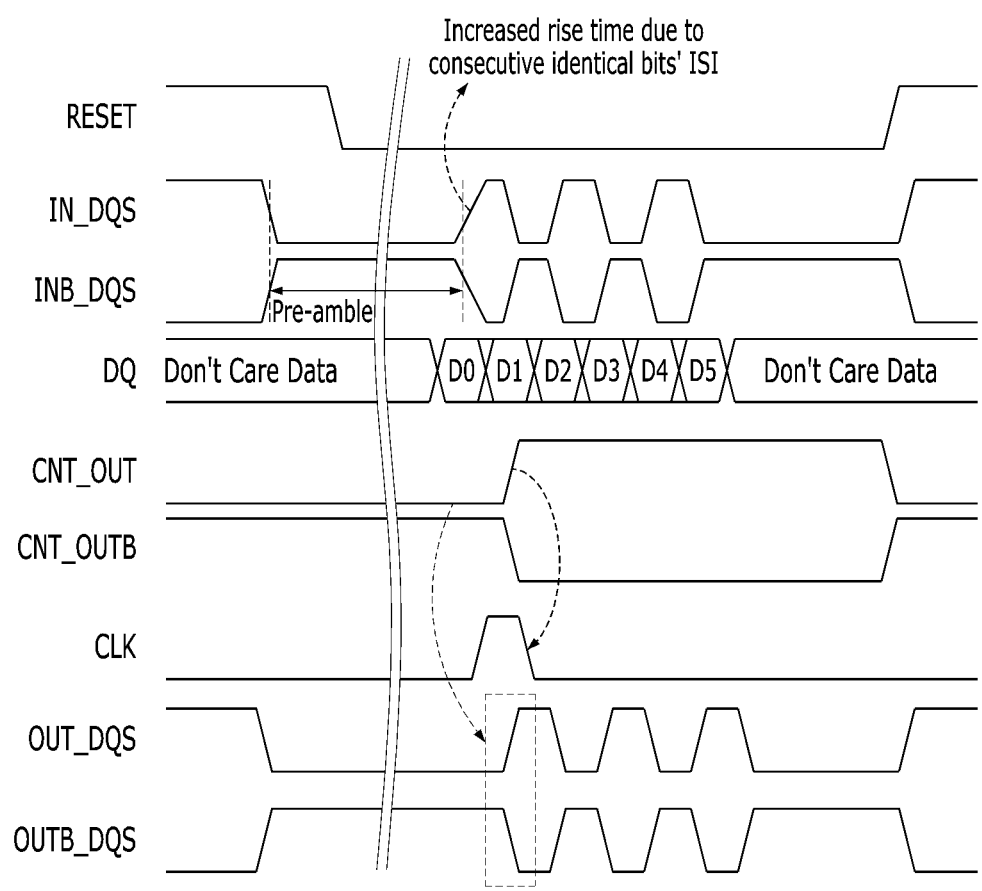
FIG. 12 is a timing diagram of the primary pulse correction module in accordance with an embodiment of the present disclosure.

FIG. 12 is a timing diagram of the primary pulse correction module in accordance with an embodiment of the present disclosure. Referring to FIGS. 7 to 12, when the data strobe signal IN_DQS becomes a logic low level and a preamble period starts, the reset signal RESET generated by the reset signal generation circuit 160 also falls to a logic low level. When the preamble period ends and the data strobe signal IN_DQS is changed from a logic low level to a logic high level for the first time, the clock CLK inputted to the clock input terminal of the primary pulse detection circuit 180 is also changed from a logic low level to a logic high level, the first corrected primary pulse output circuit control signal CNT_OUT is changed from a logic low level to a logic high level, and the second corrected primary pulse output circuit control signal CNT_OUTB is changed from a logic high level to a logic low level. Thereafter, as the second corrected primary pulse output circuit control signal CNT_OUTB is changed from a logic high level to a logic low level, the clock CLK inputted to the clock input terminal of the primary pulse detection circuit 180 is changed from a logic high level to a logic low level.

Since the first corrected primary pulse output circuit control signal CNT_OUT and the second corrected primary pulse output circuit control signal CNT_OUTB are signals which are outputted from the D flip-flop 181, a time delay occurs. As the data strobe signal IN_DQS is changed from a logic low level to a logic high level, the first corrected primary pulse output circuit control signal CNT_OUT may be changed from a logic low level to a logic high level, and the second corrected primary pulse output circuit control signal CNT_OUTB may be changed from a logic high level to a logic low level.

As the second corrected primary pulse output circuit control signal CNT_OUTB is changed from a logic high level to a logic low level, the clock CLK may be changed from a logic high level to a logic low level.

The first corrected primary pulse OUT_DQS and the second corrected primary pulse OUTB_DQS outputted by the corrected primary pulse output circuit 200 may be outputted with the duty ratio being corrected during a period before the preamble period ends, i.e., before the first corrected primary pulse output circuit control signal CNT_OUT is changed from a logic low level to a logic high level and the second corrected primary pulse output circuit control signal CNT_OUTB is changed from a logic high level to a logic low level (as indicated by the dotted line).

Thereafter, the data strobe signal IN_DQS is toggled, data D0 to D5 are inputted, and it becomes a postamble state in the absence of the data strobe signal IN_DQS. When the reset signal RESET becomes a logic high level, the first corrected primary pulse output circuit control signal CNT_OUT is changed from a logic high level to a logic low level, and the second corrected primary pulse output circuit control signal CNT_OUTB is changed from a logic low level to a logic high level. The data strobe signal IN_DQS and data after the first corrected primary pulse output circuit control signal CNT_OUT becomes a logic low level may be ignored.

Figure 13:
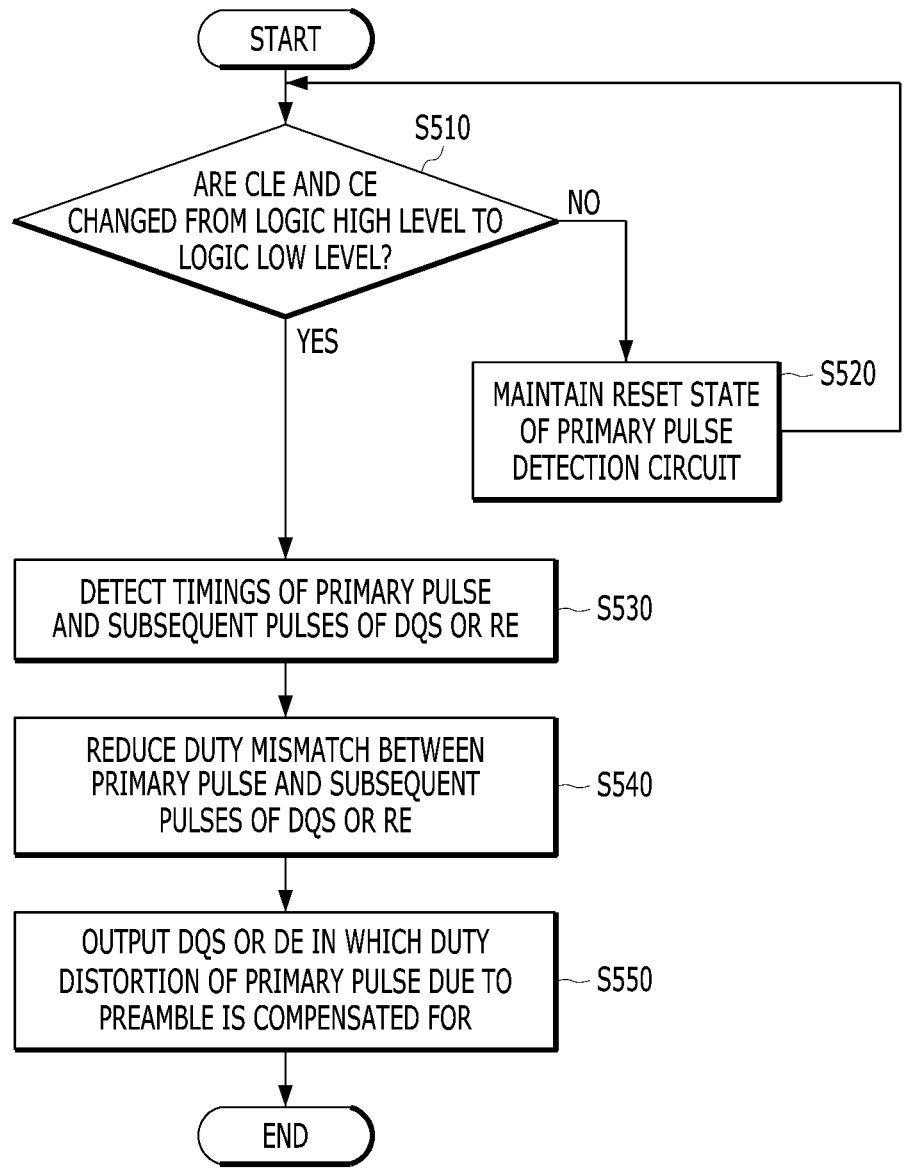
FIG. 13 is a flowchart illustrating a method for correcting a primary pulse of a data strobe signal or a read enable signal in accordance with an embodiment of the present disclosure.

FIG. 13 is a flowchart illustrating a method for correcting a primary pulse of a data strobe signal or a read enable signal in accordance with an embodiment of the present disclosure.

Referring to FIG. 13, at operation S510, the primary pulse correction module 190 may determine whether the command latch enable signal CLE and the chip enable signal CE are changed from logic high levels to logic low levels. When the command latch enable signal CLE and the chip enable signal CE are changed from logic high levels to logic low levels (YES at the operation S510), the primary pulse correction module 190 may detect timings of a primary pulse and subsequent pulses of the data strobe signal DQS or the read enable signal RE, at operation S530.

When the command latch enable signal CLE or the chip enable signal CE maintains a logic high level (NO at the operation S510), the primary pulse detection circuit 180 continuously maintains a reset state (operation S520). Then, the process returns to the operation S510, and the primary pulse correction module 190 may determine whether the command latch enable signal CLE and the chip enable signal CE are changed from logic high levels to logic low levels.

At operation S540, the primary pulse correction module 190 may reduce a duty mismatch between the primary pulse and the subsequent pulses of the data strobe signal DQS or the read enable signal RE. Namely, the primary pulse correction module 190 may reduce a duty mismatch between the pulses by adjusting the rising edge of the primary pulse of the data strobe signal DQS or the read enable signal RE.

At operation S550, the primary pulse correction module 190 may output the data strobe signal DQS or the read enable signal RE with the duty ratio thereof being corrected.

Figure 14:
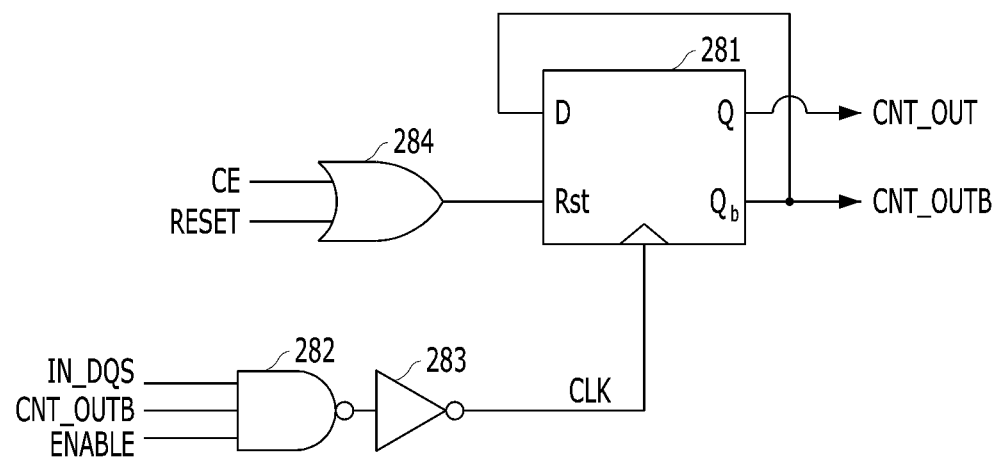
FIG. 14 is a diagram illustrating a primary pulse detection circuit in accordance with an embodiment of the present disclosure.

FIG. 14 is a diagram illustrating a primary pulse detection circuit 280 in accordance with an embodiment of the present disclosure. Referring to FIG. 14, the primary pulse detection circuit 280 may include a NAND gate 282, an inverter 283, a D flip-flop 281 and an OR gate 284. The NAND gate 282, the inverter 283 and the D flip-flop 281 may correspond to the NAND gate 182, the inverter 183 and the D flip-flop 181 of FIG. 9.

The OR gate 284 may receive the chip enable signal CE and the reset signal RESET generated by the reset signal generation circuit 160, and a signal outputted by the OR gate 284 may be inputted to the reset signal input terminal Rst of the D flip-flop 281. When the chip enable signal CE having a logic high level is first inputted to the OR gate 284 before the reset signal generation circuit 160 outputs the reset signal RESET having a logic high level by normally operating, the D flip-flop 281 may be reset, and the first corrected primary pulse output circuit control signal CNT_OUT may become a logic low level.

That is, even before the reset signal generation circuit 160 performs a normal operation, the OR gate 284 may receive the chip enable signal CE having a logic high level and transfer a logic high level to the reset signal input terminal Rst of the D flip-flop 281. As a consequence, the primary pulse detection circuit 280 may be controlled to output the first corrected primary pulse output circuit control signal CNT_OUT having a logic low level, and may be controlled to appropriately perform an operation.

Although various embodiments have been described for illustrative purposes, it will be apparent to those skilled in the art that various changes and modifications may be made without departing from the spirit and scope of the disclosure as defined in the following claims. Furthermore, the embodiments may be combined to form additional embodiments.

What is claimed is:

1. A memory system comprising:
   a memory device including a plurality of memory blocks and a primary pulse correction module; and
   a controller configured to transmit a control signal for controlling the memory device,
   wherein the primary pulse correction module includes:
   a reset signal generation circuit configured to generate a reset signal on the basis of the control signal;
   a primary pulse detection circuit configured to output a detection signal by detecting a primary pulse of the control signal on the basis of the reset signal; and
   a corrected primary pulse output circuit configured to correct a duty ratio of the primary pulse of the control signal to be outputted by adjusting a rising edge of the detection signal after the end of a preamble period of the control signal.

2. The memory system according to claim 1, wherein the control signal is one of a data strobe signal and a read enable signal.

3. The memory system according to claim 2, wherein the reset signal generation circuit is further configured to change a logic level of the reset signal when the preamble period of the control signal starts.

4. The memory system according to claim 3, wherein the reset signal generation circuit comprises a plurality of NAND gates, a plurality of inverters and at least one flip-flop.

5. The memory system according to claim 2, wherein the primary pulse detection circuit outputs the detection signal by detecting that the preamble period of the control signal ends and a logic level of the control signal is changed from a logic low level to a logic high level.

6. The memory system according to claim 5, wherein the primary pulse detection circuit comprises at least one NAND gate, at least one inverter and at least one flip-flop.

7. The memory system according to claim 5, wherein the detection signal comprises a first detection signal and a second detection signal which is an inverted signal of the first detection signal.

8. The memory system according to claim 7, wherein:
the control signal comprises a first control signal and a second control signal which is an inverted signal of the first control signal, and
the corrected primary pulse output circuit includes:
a first corrected primary pulse output circuit configured to output a first corrected primary pulse by correcting a duty ratio of a primary pulse of the first control signal on the basis of the first control signal and the first detection signal; and
a second corrected primary pulse output circuit configured to output a second corrected primary pulse by correcting a duty ratio of a primary pulse of the second control signal on the basis of the second control signal and the second detection signal.

9. The memory system according to claim 8, wherein:
the first corrected primary pulse output circuit includes:
a first PMOS transistor and a first NMOS transistor both configured to receive the first control signal;
a second PMOS transistor configured to receive a first duty correction signal; and
a second NMOS transistor configured to receive a second duty correction signal, and
wherein the second corrected primary pulse output circuit includes:
a third PMOS transistor and a third NMOS transistor both configured to receive the second control signal;
a fourth PMOS transistor configured to receive a third duty correction signal; and
a fourth NMOS transistor configured to receive a fourth duty correction signal.

10. The memory system according to claim 6, wherein the primary pulse detection circuit further comprises an OR gate which outputs a signal to a reset signal input terminal of the flip-flop by performing an OR logic operation on the chip enable signal and a signal outputted by the reset signal generation circuit.

11. A memory device comprising:
a reset signal generation circuit configured to generate a reset signal on the basis of a control signal;
a primary pulse detection circuit configured to output a detection signal by detecting a primary pulse of the control signal on the basis of the reset signal; and
a corrected primary pulse output circuit configured to correct a duty ratio of the primary pulse of the control signal to be outputted by adjusting a rising edge of the detection signal after end of a preamble period of the control signal.

12. The memory device according to claim 11, wherein the control signal is one of a data strobe signal and a read enable signal.

13. The memory device according to claim 12, wherein the reset signal generation circuit is further configured to change a logic level of the reset signal when the preamble period of the control signal starts.

14. The memory device according to claim 13, wherein the reset signal generation circuit comprises a plurality of NAND gates, a plurality of inverters and at least one flip-flop.

15. The memory device according to claim 12, wherein the primary pulse detection circuit outputs the detection signal by detecting that the preamble period of the control signal ends and a logic level of the control signal is changed from a logic low level to a logic high level.

16. The memory device according to claim 15, wherein the primary pulse detection circuit comprises at least one NAND gate, at least one inverter and at least one flip-flop.

17. The memory device according to claim 15, wherein the detection signal comprises a first detection signal and a second detection signal which is an inverted signal of the first detection signal.

18. The memory device according to claim 17, wherein:
the control signal comprises a first control signal and a second control signal which is an inverted signal of the first control signal, and
the corrected primary pulse output circuit includes:
a first corrected primary pulse output circuit configured to output a first corrected primary pulse by correcting a duty ratio of a primary pulse of the first control signal on the basis of the first control signal and the first detection signal; and
a second corrected primary pulse output circuit configured to output a second corrected primary pulse by correcting a duty ratio of a primary pulse of the second control signal on the basis of the second control signal and the second detection signal.

19. The memory device according to claim 18, wherein:
the first corrected primary pulse output circuit includes:
a first PMOS transistor and a first NMOS transistor both configured to receive the first control signal;
a second PMOS transistor configured to receive a first duty correction signal; and
a second NMOS transistor configured to receive a second duty correction signal, and
wherein the second corrected primary pulse output circuit includes:
a third PMOS transistor and a third NMOS transistor both configured to receive the second control signal;
a fourth PMOS transistor configured to receive a third duty correction signal; and
a fourth NMOS transistor configured to receive a fourth duty correction signal.

20. An operating method of a memory device, the operating method comprising:
determining whether a command latch enable signal and a chip enable signal are changed from logic high levels to logic low levels;
detecting a pulse and subsequent pulses of a data strobe signal or a read enable signal immediately after an end of a preamble section of the data strobe signal, when the command latch enable signal and the chip enable signal are changed from the logic high levels to the logic low levels; and
maintaining a reset state when the command latch enable signal or the chip enable signal maintains a logic high level;
reducing a duty mismatch between the pulse and subsequent pulses of the data strobe signal or the read enable signal by correcting a duty ratio of the pulse by adjusting a rising edge of the pulse of the data strobe signal or the read enable signal.

* * * * *